United States Patent
Galbraith et al.

(10) Patent No.: US 6,636,562 B1
(45) Date of Patent: Oct. 21, 2003

(54) UNCONSTRAINED EQUALIZATION METHOD AND APPARATUS WITH GAIN AND TIMING BIAS TO CONTROL RUNAWAY FOR DIRECT ACCESS STORAGE DEVICE (DASD) DATA CHANNELS

(75) Inventors: Richard Leo Galbraith, Rochester, MN (US); John Jeffrey Stephenson, Rochester, MN (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 09/489,316

(22) Filed: Jan. 21, 2000

(51) Int. Cl.⁷ .......................... H03H 7/30; G11B 5/035
(52) U.S. Cl. .......................... 375/232; 379/229; 360/65
(58) Field of Search ................... 375/232, 229, 375/262, 327, 265, 350; 360/39, 40, 46, 32, 55, 65; 342/203–204; 324/76.28; 708/322, 323, 425, 819, 314, 300

(56) References Cited

U.S. PATENT DOCUMENTS 5,220,466 A * 6/1993 Coker et al. ................. 360/46
5,793,554 A * 8/1998 Chainer et al. ............... 360/75
6,031,672 A * 2/2000 Bergquist et al. ............ 360/46
6,104,766 A * 8/2000 Coker et al. ................. 375/341

OTHER PUBLICATIONS

U.S. patent application Ser. No. 09/407,595 filed Sep. 28, 1999 by Bush et al., entitled Equalization Method and Apparatus with Gain Adjustment for Direct Access Storage Device (DASD) Data Channels.

* cited by examiner

Primary Examiner—Khai Tran
(74) Attorney, Agent, or Firm—Joan Pennington

(57) ABSTRACT

An unconstrained equalization method and apparatus with gain and timing bias to control runaway are provided for a direct access storage device (DASD) data channel. A direction for moving each of a plurality of tap weights of a finite impulse response (FIR) filter is calculated. New tap weights are determined for each of a plurality of tap weights in the direction. A gain of the FIR filter for the new tap weights is compared with a set threshold gain value. A polarity of a gain bias is set to adjust a gain of a gain loop of the data channel by a preselected amount responsive to the compared gain and set threshold gain values, A phase lag of the FIR filter for the new tap weights is compared with a set threshold phase lag value. A polarity of a timing bias is set to adjust a phase lag of a timing loop of the data channel by a preselected amount responsive to the compared phase lag and set threshold phase lag values.

12 Claims, 3 Drawing Sheets

UNCONSTRAINED EQUALIZATION METHOD AND APPARATUS WITH GAIN AND TIMING BIAS TO CONTROL RUNAWAY FOR DIRECT ACCESS STORAGE DEVICE (DASD) DATA CHANNELS

FIELD OF THE INVENTION

The present invention relates to a direct access storage device (DASD), and more particularly to an unconstrained equalization method and apparatus with gain and timing bias to control runaway for a direct access storage device (DASD) data channel.

DESCRIPTION OF THE RELATED ART

In today's disk drives the readback signal is equalized using a finite impulse response (FIR) filter. There are numerous algorithms used to find the FIR tap weights that will result in giving the optimum equalization. In all the algorithms, the FIR taps must have their gain and phase shift constrained during the equalization process in order to prevent interactions with the channel gain and timing loops. For example, the gain and timing loops inputs come from the output of the FIR. If the FIR gain was not constrained then if its gain were to begin increasing during the equalization process the channel gain loop would see an increasing signal amplitude and begin reducing the incoming data signal. Thus the FIR gain and the channel gain loop would be fighting one another. The same problem would exist for the timing loop. The standard method used to avoid this problem is to constrain the tap weights either by holding some taps at a constant value or to keep the sum of the even and the sum of the odd taps each equal to some specified values.

These constraints prevent the FIR from delivering the optimum equalization.

A need exists for a method for preventing the gain and timing loops from fighting with the equalization algorithm and that also allows the FIR tap weights to be unconstrained. A need exists for a resulting equalization algorithm that can find the optimum set of FIR tap weights.

SUMMARY OF THE INVENTION

A principal object of the present invention is to provide an unconstrained equalization method and apparatus with gain and timing bias to control runaway for a direct access storage device (DASD) data channel. Other objects are to provide such equalization method and apparatus substantially without negative effects, and that overcome many of the disadvantages of prior art arrangements.

In brief, an unconstrained equalization method and apparatus with gain and timing bias to control runaway are provided for a direct access storage device (DASD) data channel. A direction for moving each of a plurality of tap weights of a finite impulse response (FIR) filter is calculated. New tap weights are determined for each of a plurality of tap weights in the direction. A gain of the FIR filter for the new tap weights is compared with a set threshold gain value. A polarity of a gain bias is set to adjust a gain of a gain loop of the data channel by a preselected amount responsive to the compared gain and set threshold gain values.

In accordance with features of the invention, a phase lag of the FIR filter for the new tap weights is compared with a set threshold phase lag value. A polarity of a timing bias is set to adjust a phase lag of a timing loop of the data channel by a preselected amount responsive to the compared phase lag and set threshold phase lag values.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
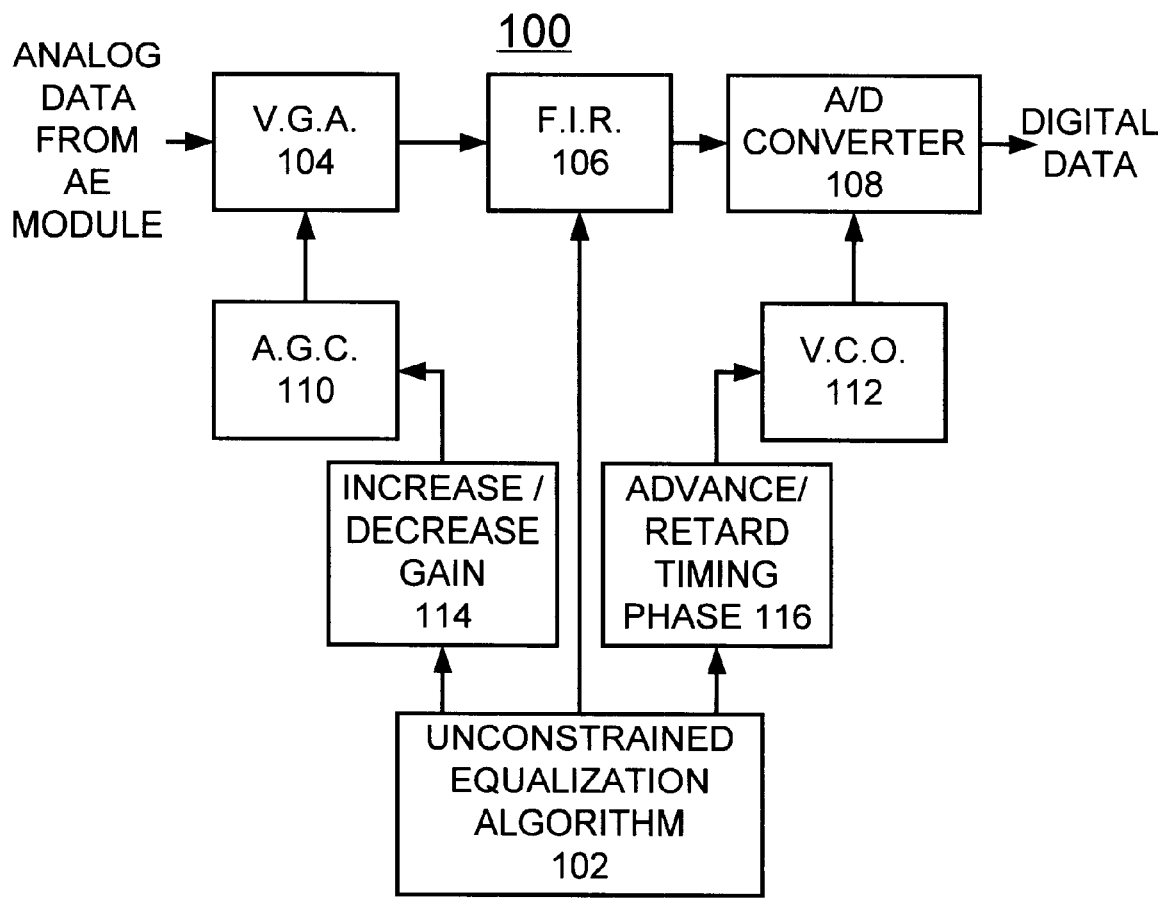
FIG. 1 is a schematic and block diagram of an affected portion of a direct access storage device (DASD) data channel embodying the present invention.

Having reference now to the drawings, in FIG. 1, there is shown a portion of a direct access storage device (DASD) data channel embodying the present invention generally designated by the reference character 100. Data channel 100 is shown in simplified form sufficient for an understanding of the present invention. The utility of the present invention is not restricted to the details of a particular data channel. Data channel 100 includes an unconstrained equalization algorithm block 102 of the preferred embodiment. Analog data from an arm electronics module (not shown) is applied to a variable gain amplifier (VGA) 104. An amplified readback signal is applied to a finite impulse response (FIR) filter 106. The filtered output of FIR 106 is applied to an analog-to-digital converter (ADC) 108. An automatic gain control (AGC) circuit 110 provides a gain control signal to the VGA 104. A voltage controlled oscillator (VCO) provides a timing control signal to the ADC 108.

Typically the digital output of ADC 108 is applied to a data detector (not shown), a decoder (not shown) and derandomizer (not shown) to provide user output data. It should be understood that the FIR 106 can be on either side of the ADC 108.

In accordance with features of the invention, unconstrained equalization algorithm block 102 provides a control signal to an increase or decrease gain block 114 coupled to the AGC 110. Unconstrained equalization algorithm block 102 provides a control signal to an advance or retard timing phase block 116 coupled to the VCO 112. Unconstrained equalization algorithm block 102 provides a control signal to the FIR filter 106 for adjustment of the tap weights in accordance with the preferred embodiment.

In most disk drives there is a data synchronizing field written on the media preceding each customer data field. The frequency of this field is one fourth the bit data rate. This frequency is chosen to allow the gain and timing loops to operate as described below.

The gain and timing loops have two modes of operation in most disk drives. Mode 1 is referred to as the acquisition mode. It is operated while in the data synchronizing field and its input signal. comes from upstream of the FIR filter 106. After a certain number of bits but while still in the synchronizing field the loops are switched to mode 2 which is referred to as the tracking mode. Its input signal comes from downstream (the output) of the FIR filter 106. The gain of an FIR filter 106 changes as a function of frequency. In order to avoid a transient in the signal when the switch from acquisition mode to tracking mode occurs, a FIR gain of 1 at the synchronizing frequency is desirable. Also the sampling points for the timing loop switches, for example, by 45 degrees when going from acquisition to tracking modes. Thus a FIR phase shift of 45 degrees at the synchronizing frequency is desired. The frequency response of the FIR at the synchronizing frequency can be represented by a complex number (A+Bi). Where A is the real part and B is the imaginary part. The real part is equal to the sum of the even taps with alternating signs starting with plus and the odd part is the sum of the odd taps with alternating signs starting with minus for an 8-tap FIR filter 106.

The gain of the FIR (FIR_GAIN) at the synch frequency is square root of $(A^2+B^2)$ and the phase (FIR_PHASE) is arctan of (B/A). These two equations are used in the equalization method of the preferred embodiment.

For ease of implementation into circuitry, the following equations can be used. A+B is compared to 2. If A+B is greater than 2, then the gain is too large and if A+B is less than 2, then the gain is too small. For phase, the arctan of (B/A) where A equals B or arctan 1 is 45°. Where A is bigger than B, phase shift is less than 45° and where A is less than B, phase shift is greater than 45°.

A simplified explanation of how the gain loop operates follows. In the tracking mode the gain loop compares the signal amplitude it receives from the FIR output to an expected value and generates a gain error (GE). GE can be positive or negative. The gain control loop then multiplies the GE times a control constant (GK) and generates a gain control output (GO). So in equation form GO=GE times GK. Assume that a positive GO will increase the signal amplitude and a negative GO will decrease the signal amplitude.

If while running the equalization algorithm the FIR_GAIN increases then its output signal amplitude would increase and therefore the GE would go negative which would then force the GO to go negative and cause the signal amplitude to decrease. On the next iteration of the equalization algorithm the FIR would again attempt to increase its output amplitude since the gain control loop had caused the signal to be decreased which is not what the FIR wanted. If the operation were to continue the FIR taps would forever be getting larger and the gain control output would eventually saturate at its minimum.

In accordance with the preferred embodiment, this gain problem is solved by introducing a bias term (GB) term into the gain control loop with the increase/decrease gain block 114. The magnitude of this bias term GB is selected prior to starting equalization. The new gain control equation of the preferred embodiment is GO=(GE+GB) times GK. The sign of the GB term can be modified each iteration of the equalization algorithm. Upon starting equalization, a plus GB is applied to the gain control equation. Since a plus GB will force the GO to call for more gain, the resulting gain of the FIR after equalization is completed will be less than the desired gain value of the FIR filter 106 of 1. So after the first iteration of the equalization algorithm the FIR taps selected would give a FIR_GAIN less than 1, then a negative GB value is applied to the gain loop and this forces the resulting GO to call for less gain. This lower GO term will then cause a FIR_GAIN greater than the desired value of 1. By toggling the sign of the GB, the FIR_GAIN switches between being greater than 1 and being less than 1, the FIR_GAIN is prevented from running away and also forces the FIR_GAIN to be close to its target gain of 1.

The timing loop has basically the same control equation as the gain loop, TO=(TE+TB) times TK; where TO is the timing output, TE is the timing error, TB is a timing bias of the preferred embodiment provided with advance retard timing phase block 116, and TK is a control constant. As the equalization algorithm proceeds if the FIR_PHASE has a phase shift of less or greater than a set phase of 45 degrees then the sign of the TB is toggled which will tend to move the sampling phase near the desired 45 degrees. The FIR phase shift will not run away and will be near its target of 45 degrees.

This method of using bias to the gain and timing loop which then forces the FIR gain and timing to remain close to the desired unity gain and 45 degrees of phase shift is the essential feature of the invention and offers significant improvement over other methods. Other conventional solutions to this problem forced constraints on either the taps themselves or required moving the taps in pairs. Both these methods led to sub-optimal equalization results.

Figure 2A:
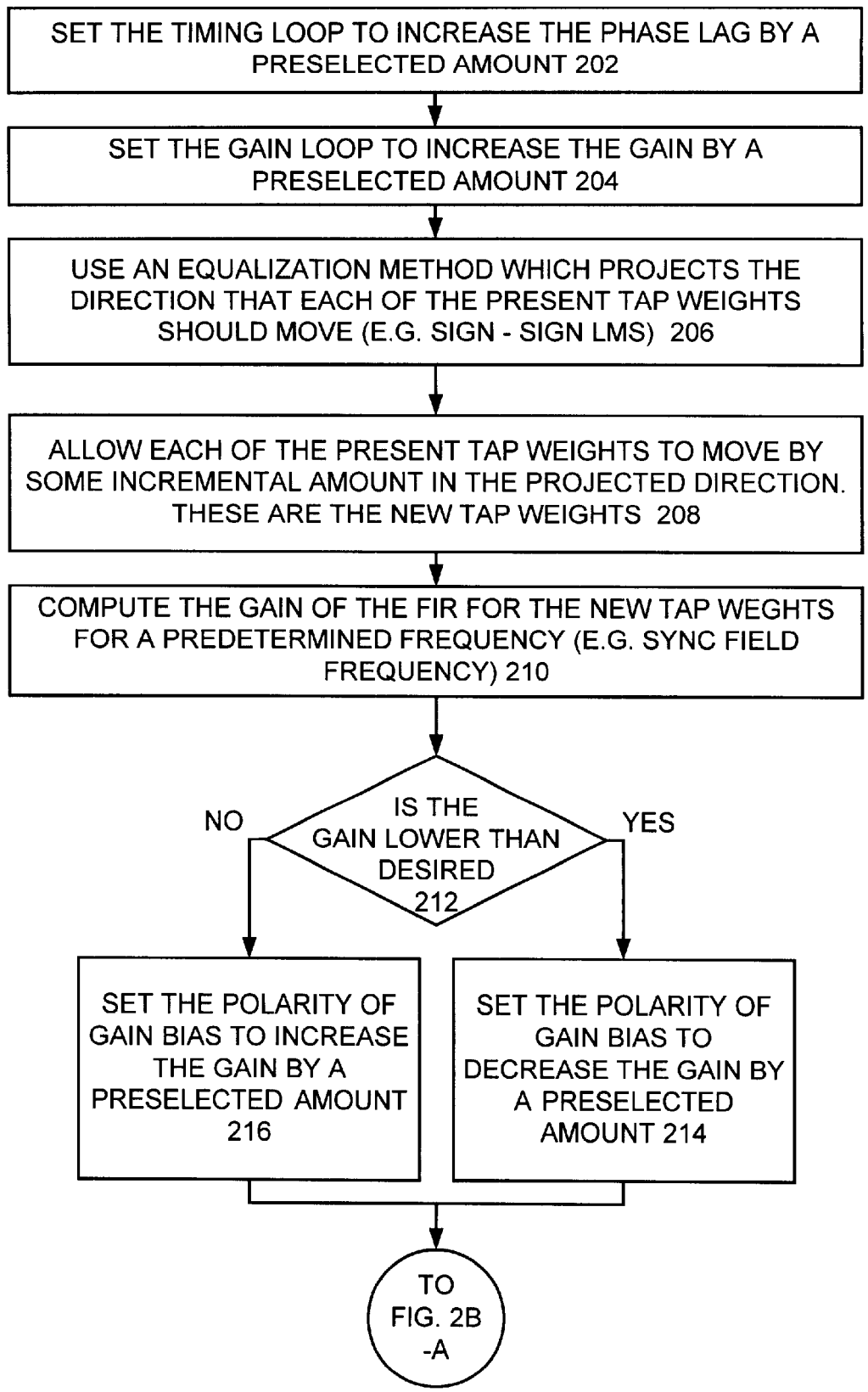
FIGS. 2A and 2B are flow charts illustrating exemplary steps performed by the unconstrained equalization algorithm block of FIG. 1.
Figure 2B:
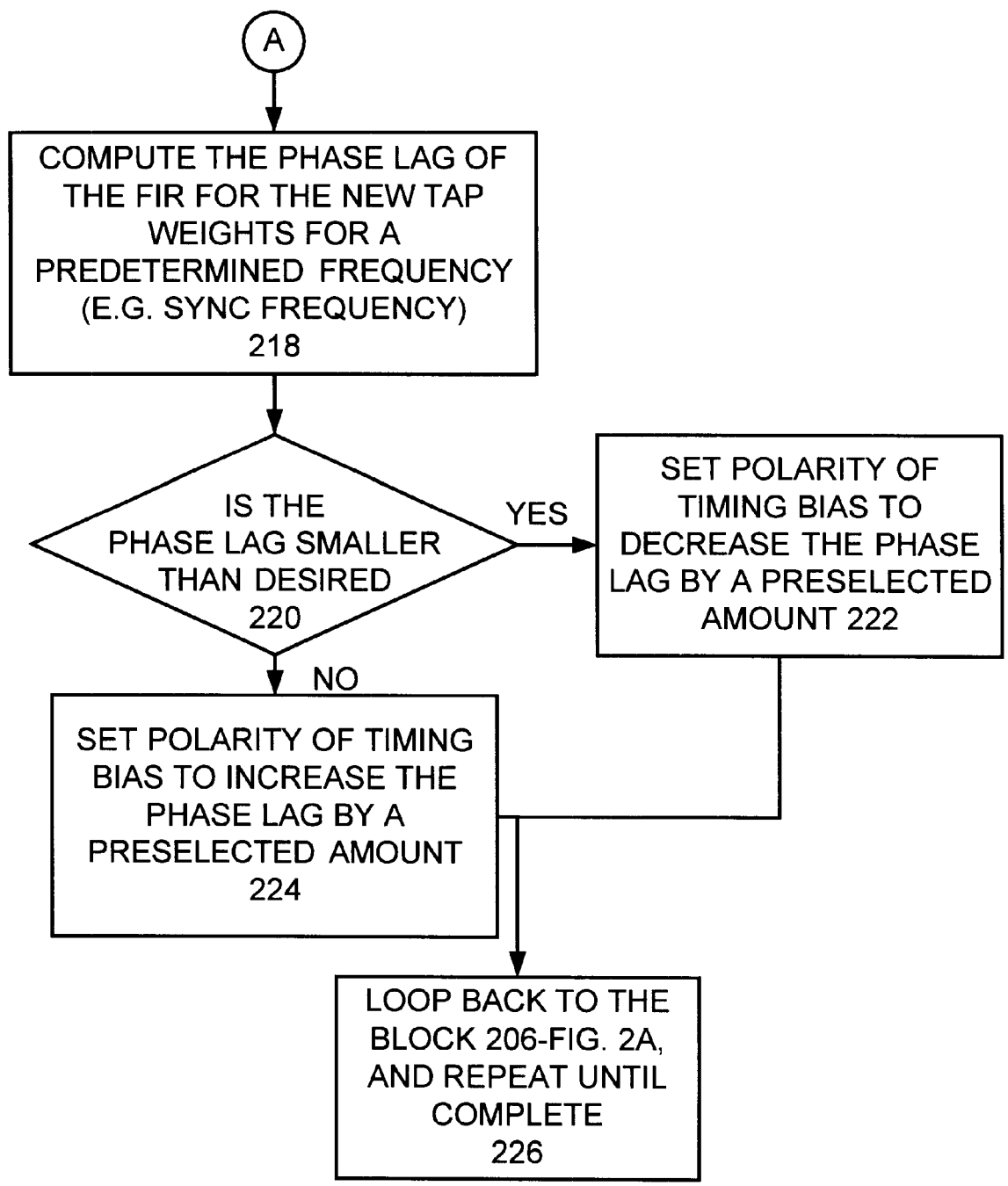

Referring to FIGS. 2A and 2B, there are shown illustrative steps of the equalization method performed by the unconstrained equalization algorithm block 102 of the preferred embodiment. First the timing loop is set to increase the phase lag by a preselected amount as indicated in a block 202. The gain loop is set to increase the gain by a preselected amount as indicated in a block 204. Next as indicated in a block 206, an equalization method is used which projects the direction that each of the present tap weights should move, for example, sign—sign least mean square (LMS). Each of the present tap weights are allowed to move by some incremental amount in the projected directions as indicated in a block 208. These are the new tap weights. Next the gain of the FIR filter 106 for the new tap weights is computed for a predetermined frequency, for example, the sync field frequency as indicated in a block 210. Then it is determined whether the gain is lower than desired as indicated in a decision block 212. When determined that the gain is lower than desired, then the polarity of the gain bias is set to decrease the gain by a preselected amount as indicated in a block 214. When determined that the gain is not lower than desired, then then the polarity of the gain bias is set to increase the gain by a preselected amount as indicated in a block 216.

Referring to FIG. 2B, next the phase lag of the FIR filter 106 for the new tap weights is computed for a predetermined frequency, for example, the sync field frequency as indicated in a block 218. Then it is determined whether the phase lag is smaller than desired, for example less than 45°, as indicated in a decision block 220. When the phase lag is smaller than desired, then the polarity of the timing bias is set to decrease the phase lag by a preselected amount as indicated in a block 222. Otherwise, when the phase lag is not less than desired, then the polarity of the timing bias is set to increase the phase lag by a preselected amount as indicated in a block 224. Then the sequential operations loop back to block 206 in FIG. 2A and are repeated until complete as indicated in a block 226.

While the present invention has been described with reference to the details of the embodiments of the invention shown in the drawing, these details are not intended to limit the scope of the invention as claimed in the appended claims.

What is claimed is:

1. An unconstrained equalization method with gain and timing bias to control runaway for a direct access storage device (DASD) data channel comprising the steps of:

calculating a direction for moving each of a plurality of tap weights in a finite impulse response (FIR) filter;

determining new tap weights for each of a plurality of tap weights in said direction;

comparing a gain of said FIR filter for said new tap weights with a set threshold gain value; and setting a polarity of a gain bias to adjust a gain of a gain loop of the data channel by a preselected amount responsive to said compared gain and set threshold gain values; said polarity of said gain bias being modified with successive iterations of the calculating, determining, and comparing steps forcing said gain of said FIR filter close to said set threshold value.

2. An unconstrained equalization method for a direct access storage device (DASD) data channel as recited in claim 1 further includes the steps of
comparing a phase lag of said FIR filter for said new tap weights with a set threshold phase lag value;
setting a polarity of a timing bias to adjust a phase lag of a timing loop of said data channel by a preselected amount responsive to said compared phase lag and set threshold phase lag values; said polarity of said timing bias being modified with successive iterations of the calculating, determining, and comparing steps forcing said phase lag of said FIR filter close to said set threshold phase lag value.

3. An unconstrained equalization method for a direct access storage device (DASD) data channel as recited in claim 1 wherein said step of comparing said gain with a set threshold gain value identifies said gain less than said set threshold gain value and said step of setting a polarity of a gain bias to adjust a gain of a gain loop of the data channel responsive to said compared gain and set threshold gain values includes the step of setting said polarity of said gain bias to decrease said gain by said preselected amount.

4. An unconstrained equalization method for a direct access storage device (DASD) data channel as recited in claim 1 wherein said step of comparing said gain with a set threshold gain value identifies said gain greater than said set threshold gain value and said step of setting a polarity of a gain bias to adjust a gain of a gain loop of the data channel responsive to said compared gain and set threshold gain values includes the step of setting said polarity of said gain bias to increase said gain,by said preselected amount.

5. An unconstrained equalization method for a direct access storage device (DASD) data channel as recited in claim 2 wherein said step of comparing said phase lag with a set threshold phase lag value identifies said phase lag smaller than said set threshold phase lag value and said step of setting a polarity of a timing bias to adjust a phase lag of a timing loop of said data channel by a preselected amount responsive to said compared phase lag and set threshold phase lag values includes the step of setting said polarity of said timing bias to decrease said phase lag of said timing loop of said data channel by said preselected amount.

6. An unconstrained equalization method for a direct access storage device (DASD) data channel as recited in claim 2 wherein said step of comparing said phase lag with a set threshold phase lag value identifies said phase lag greater than said set threshold phase lag value and said step of setting a polarity of a timing bias to adjust a phase lag of a timing loop of said data channel by a preselected amount responsive to said compared phase lag and set threshold phase lag values includes the step of setting said polarity of said timing bias to increase said phase lag of said timing loop of said data channel by said preselected amount.

7. An unconstrained equalization apparatus for a direct access storage device (DASD) data channel including a finite impulse response (FIR) filter, a gain loop and a timing loop, said equalization apparatus comprising:
an unconstrained equalization algorithm block coupled to the FIR filter, said unconstrained equalization algorithm block for calculating a direction for moving each of a plurality of tap weights; for determining new tap weights for each of a plurality of tap weights in said direction; and for comparing a gain of said FIR filter for said new tap weights with a set threshold gain value and for comparing a phase lag of said FIR filter for said new tap weights with a set threshold phase lag value;
a gain control block coupled to said unconstrained equalization algorithm block for setting a polarity of a gain bias to adjust a gain of a gain loop of the data channel by a preselected amount responsive to said compared gain and set threshold gain values; said polarity of said gain bias being modified with successive iterations of the calculating, determining, and comparing steps of said unconstrained equalization algorithm; and
a timing control block coupled to said unconstrained equalization algorithm block for setting a polarity of a timing bias to adjust a phase lag of a timing loop of said data channel by a preselected amount responsive to said compared phase lag and set threshold phase lag values; said polarity of said timing bias being modified with successive iterations of the calculating, determining, and comparing steps of said unconstrained equalization algorithm.

8. An unconstrained equalization apparatus for a direct access storage device (DASD) data channel as recited in claim 7 wherein said gain control block is responsive to said compared gain greater than said set threshold gain value for setting said polarity of said gain bias to increase said gain by said preselected amount.

9. An unconstrained equalization apparatus for a direct access storage device (DASD) data channel as recited in claim 7 wherein said gain control block is responsive to said compared gain less than said set threshold gain value for setting said polarity of said gain bias to decrease said gain by said preselected amount.

10. An unconstrained equalization apparatus for a direct access storage device (DASD) data channel as recited in claim 7 wherein said timing control block is responsive to said compared phase lag greater than set threshold phase lag value for setting said polarity of said timing bias to increase said phase lag of said timing loop of said data channel by said preselected amount.

11. An unconstrained equalization apparatus for a direct access storage device (DASD) data channel as recited in claim 7 wherein said timing control block is responsive to said compared phase lag less than set threshold phase lag value for setting said polarity of said timing bias to decrease said phase lag of said timing loop of said data channel by said preselected amount.

12. An unconstrained equalization method for a direct access storage device (DASD) data channel comprising the steps of:
calculating a direction for moving each of a plurality of tap weights;
determining new tap weights for each of a plurality of tap weights in said direction;
comparing a gain of said FIR filter for said new tap weights with a set threshold gain value;
setting a polarity of a gain bias term to adjust a gain of a gain loop of the data channel by a preselected amount responsive to said compared gain and set threshold gain values; said polarity of said gain bias term being modified with successive iterations of the calculating, determining, and comparing steps forcing said gain of said FIR filter close to said set threshold value;
comparing a phase lag of said FIR filter for said new tap weights with a set threshold phase lag value;
setting a polarity of a timing bias term to adjust a phase lag of a timing loop of said data channel by a preselected amount responsive to said compared phase lag and set threshold phase lag values; said polarity of said timing bias term being modified with successive iterations of the calculating, determining, and comparing steps forcing said phase lag of said FIR filter close to said set threshold phase lag value.

* * * * *